(12) United States Patent
Shin (10) Patent No.: US 7,626,195 B2
(45) Date of Patent: Dec. 1, 2009

(54) ORGANIC LIGHT-EMITTING DEVICE AND METHOD OF FABRICATING THE SAME

(75) Inventor: Hyun-Eok Shin, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 310 days.

(21) Appl. No.: 10/945,969

(22) Filed: Sep. 22, 2004

(65) Prior Publication Data

US 2005/0116624 A1    Jun. 2, 2005

(30) Foreign Application Priority Data

Nov. 29, 2003  (KR) .................. 10-2003-0086149

(51) Int. Cl.
*H01L 51/52* (2006.01)
(52) U.S. Cl. ............... 257/40; 257/103; 257/E51.018; 257/E51.019; 438/99
(58) Field of Classification Search .............. 252/301.16–301.35; 257/40, E51.012–E51.022, 257/103; 438/82, 99
See application file for complete search history.

(56) References Cited

U.S. PATENT DOCUMENTS

| | | | | |
|---|---|---|---|---|
| 5,399,936 | A * | 3/1995 | Namiki et al. ............... | 313/504 |
| 6,366,017 | B1 * | 4/2002 | Antoniadis et al. .......... | 313/506 |
| 6,501,217 | B2 * | 12/2002 | Beierlein et al. ............ | 313/504 |
| 6,517,958 | B1 * | 2/2003 | Sellinger et al. ............ | 428/690 |
| 6,680,765 | B1 * | 1/2004 | Maeda et al. ................ | 349/117 |
| 7,030,553 | B2 * | 4/2006 | Winters et al. .............. | 313/504 |
| 2002/0021088 | A1 * | 2/2002 | Howard et al. .............. | 313/504 |
| 2002/0117962 | A1 * | 8/2002 | Beierlein et al. ............ | 313/504 |
| 2003/0234608 | A1 * | 12/2003 | Lee et al. ................... | 313/504 |
| 2004/0004686 | A1 * | 1/2004 | Ogawa et al. ............... | 349/114 |
| 2004/0056590 | A1 * | 3/2004 | Lim et al. ................... | 313/506 |

FOREIGN PATENT DOCUMENTS

| | | |
|---|---|---|
| CN | 1168076 | 12/1997 |
| CN | 1456026 | 11/2003 |
| JP | 10-289784 | 10/1998 |
| KR | 10-2003-0001735 | 1/2003 |
| WO | 03-022011 | 3/2003 |

(Continued)

OTHER PUBLICATIONS

Jean, F., et al. "Microcavity Organic Light-Emitting Diodes on Silicon." Appl. Phys. Lett. vol. 81 (2002): pp. 1717-1719.*

(Continued)

*Primary Examiner*—Douglas M Menz
*Assistant Examiner*—Matthew W Such
(74) *Attorney, Agent, or Firm*—Robert E. Bushnell, Esq.

(57) ABSTRACT

An organic light-emitting device is constructed with an anode provided with a reflective metal layer, a transparent conductive layer, and a reflective metal oxide layer interposed therebetween, a cathode, and an organic functional layer interposed between the transparent conductive layer of the anode and the cathode, and provided with at least an organic emission layer. With this configuration, the reflective anode has high reflectivity, the reflectivity thereof is not substantially changed depending on wavelengths, and the reflective anode is free from defects caused by a galvanic phenomenon.

17 Claims, 4 Drawing Sheets

FOREIGN PATENT DOCUMENTS

WO    WO 03055275 A1 *    7/2003

OTHER PUBLICATIONS

Saha, S.K., et al. "Reaction Mechanisms in Aluminum-Indium Tin Oxide Ohmic Contact Metallization with Co and Ni Barrier Layers for Active-Matrix-Display Applications." J. Electrochem. Soc. vol. 146 (1999): pp. 3134-3138.*

Riccius, H.D. and Siemsen, K.J. "Point-Contact Diodes." Appl. Phys. A, vol. 35 (1984): pp. 67-74.*

Hotovy, I., et al. "Preparation and Structural Characterization of Nickel Oxide Films For Gas Sensor Devices." IEEE, ASDAM '98, Second International Conference on Advanced Semiconductor Devices and Microsystems (Oct. 5-7, 1998): pp. 175-178.*

Saha, S.K., et. al. "Reaction Mechanisms in Aluminum-Indium Tin Oxide Ohmic Contact Metallization with Co and Ni Barrier Layers for Active-Matrix-Display Applications." J. Electrochem. Soc., vol. 146, No. 8 (1999): pp. 3134-3138.*

Weijtens, C.H.L. and Van Loon, P.A.C. "Low Resistive, Ohmic Contact to Indium Tin Oxide." J. Electrochem. Soc., vol. 137, No. 12 (Dec. 1990): pp. 3928-3930.*

Newman, R. And Chrenko, R.M. "Optical Properties of Nickel Oxide." Phys. Rev., vol. 114, No. 6 (Jun. 15, 1959): pp. 1507-1513.*

Korean Office Action of the Korean Patent Application No. 10-2003-0086149, mailed on Jan. 27, 2006.

Chinese Certificate of Patent issued in corresponding Chinese Patent Application No. 200410089745.6 on Dec. 17, 2008.

*Office action* from Chinese Patent Office issued in Applicant's corresponding Chinese Patent Application No. 200410089745.6 dated Sep. 21, 2007.

\* cited by examiner

ORGANIC LIGHT-EMITTING DEVICE AND METHOD OF FABRICATING THE SAME

CLAIM OF PRIORITY

This application claims all the benefits accruing under 35 U.S.C. §119 from Korea Patent Application No. 2003-86149 filed on Nov. 29, 2003, the disclosure of which is incorporated herein by reference in its entirety.

BACKGROUND OF THE INVENTION

1. Field of the Invention

The present invention relates to an organic light-emitting device and a method of fabricating the same and, more particularly, to an organic light-emitting device with a reflective anode and a method of fabricating the same.

2. Description of the Related Art

Generally, an organic light-emitting device comprises an anode, an organic emission layer placed on the anode, and a cathode placed on the organic emission layer. In the organic light-emitting device, when a voltage is applied between the anode and the cathode, a hole is injected from the anode into the organic emission layer, and an electron is injected from the cathode into the organic emission layer. The hole and electron injected into the organic emission layer are combined to create excitons, wherein an electronic transition of the excitons from an excited state to a ground state causes light to be emitted.

In the organic light-emitting device, the anode is formed in a reflective type to reflect the light, and the cathode is formed in a transmissive type to transmit the light, so that the light emitted from the organic emission layer can be emitted in a direction toward the cathode.

Here, it is preferable that the reflective anode is made of a conductive material which has excellent reflective properties and a proper work function, but there is no single material that simultaneously has such properties and is applicable. Therefore, to satisfy the foregoing properties, the reflective anode has been made of material having a multi-layered structure.

However, the conventional organic light-emitting device suffers from one or more of the following disadvantages: deterioration of the interfacial properties between a reflective metal layer and a transparent conductive layer may cause the reflective metal layer to have low reflectivity; and corrosion caused by a galvanic phenomenon may occur between the reflective metal layer and the transparent conductive layer, wherein the corrosion may be spread along an interface between the reflective metal layer and the transparent conductive layer.

SUMMARY OF THE INVENTION

It is an object of the present invention to provide an improved organic light-emitting device.

It is further an objective of the present invention to provide an organic light-emitting device with a reflective anode and a method of fabricating the same, in which the reflective anode has high reflectivity and is free from defects caused by a galvanic phenomenon.

To achieve the above and other objectives, an aspect of the present invention provides an organic light-emitting device comprising: an anode including a reflective metal layer, a transparent conductive layer, and a reflective metal oxide layer interposed therebetween; a cathode; and an organic functional layer interposed between the transparent conductive layer of the anode and the cathode, and provided with at least an organic emission layer.

Preferably, the reflective metal oxide layer is a native oxide layer or a sputtered oxide layer. And the reflective metal oxide layer may have a thickness of 10 to 50 Å.

Another aspect of the invention provides a method of fabricating an organic light-emitting device, the method comprising the steps of: providing a substrate; forming a reflective metal layer on the substrate; forming a reflective metal oxide layer on the reflective metal layer; forming a transparent conductive layer on the reflective metal oxide layer; forming an organic functional layer having at least an organic emission layer on the transparent conductive layer; and forming a cathode on the organic functional layer.

The step of forming the reflective metal oxide layer is performed by exposing the reflective metal layer to air or using a sputtering method. Preferably, the steps of forming the reflective metal layer and the reflective metal oxide layer are performed in situ by the sputtering method.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, a layer placed on another layer or a substrate indicates that a layer is directly formed on another layer or the substrate or that a layer is formed thereon via a third layer. Like numbers refer to like elements throughout the specification.

Figure 1:
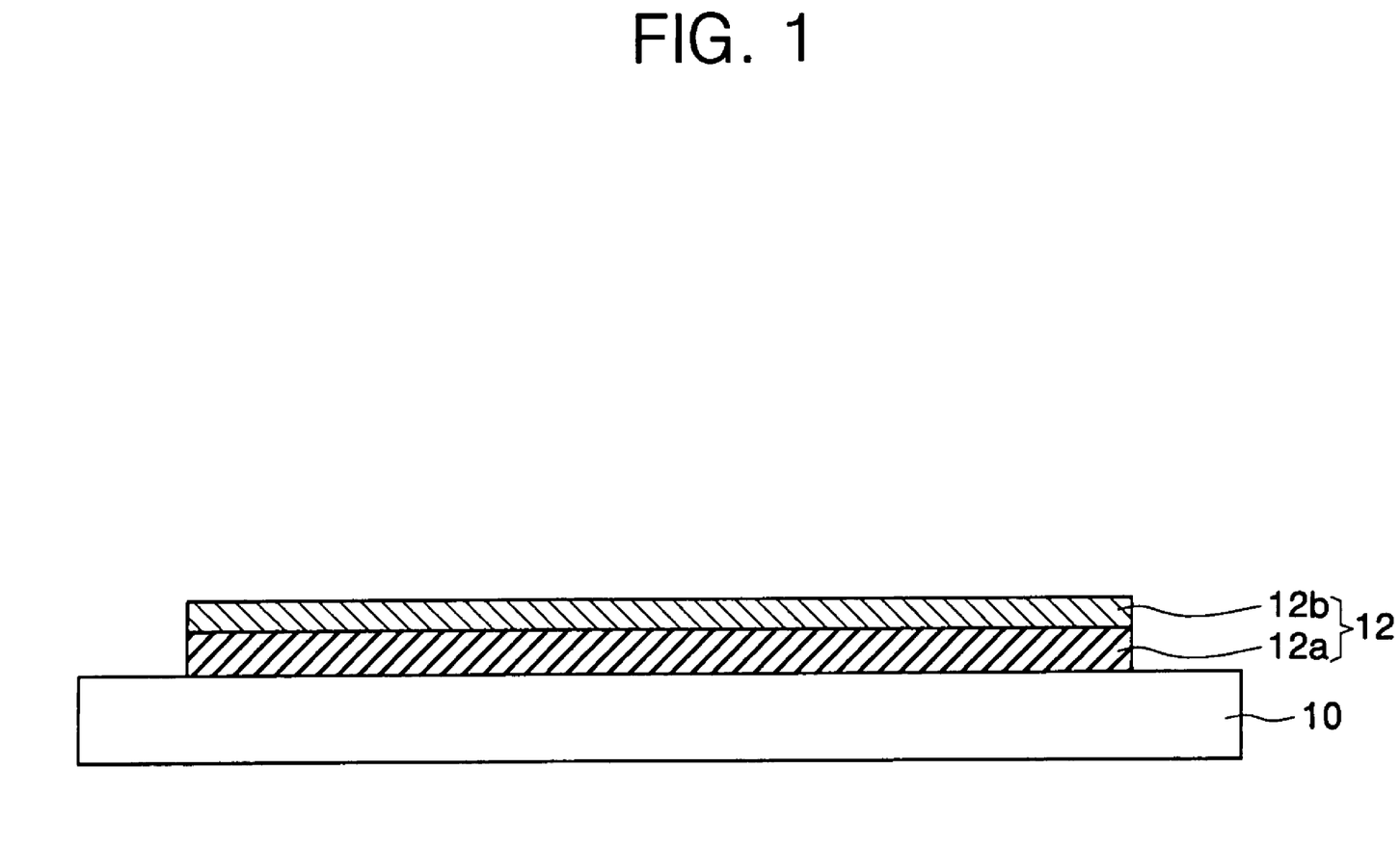
FIG. 1 is a cross-sectional view for illustrating a method of fabricating an organic light-emitting device with a conventional reflective anode.

FIG. 1 is a cross-sectional view for illustrating a method of fabricating an organic light-emitting device with a conventional reflective anode.

Referring to FIG. 1, an aluminum layer 12a and an indium tin oxide (ITO) layer 12b are sequentially formed on a substrate 10. Then, a photoresist pattern is formed on the ITO layer 12b, and the ITO layer 12b and the aluminum layer 12a are sequentially etched, using the photoresist pattern as a mask. Thus, an anode 12 is formed to have stacked structure of the aluminum layer 12a and the ITO layer 12b. Thereafter, the photoresist pattern is removed using a strip solution. Subsequently, an organic emission layer (not shown) is formed on the anode 12, and a cathode (not shown) is formed on the organic emission layer, thereby fabricating the organic light-emitting device.

The ITO layer 12b of the anode 12 has a high work function and is transparent, and the aluminum layer 12a has excellent reflective properties. Therefore, the anode 12 not only readily injects the hole to the organic emission layer, but also effectively reflects the light emitted from the organic emission layer.

However, In general, a work function difference between the aluminum layer 12b and the ITO layer 12b is relatively large, so that the interfacial properties therebetween may be deteriorated. Such deterioration of the interfacial properties may cause the aluminum layer 12a, i.e., the reflective anode 12 to have low reflectivity. Further, while the photoresist pattern is removed by the strip solution, the aluminum layer 12a and the ITO layer 12b are also exposed to the strip solution. Therefore, corrosion caused by a galvanic phenomenon may occur between the aluminum layer 12a and the ITO layer 12b, wherein the corrosion may be spread along an interface between the aluminum layer 12a and the ITO layer 12b.

Figure 2:
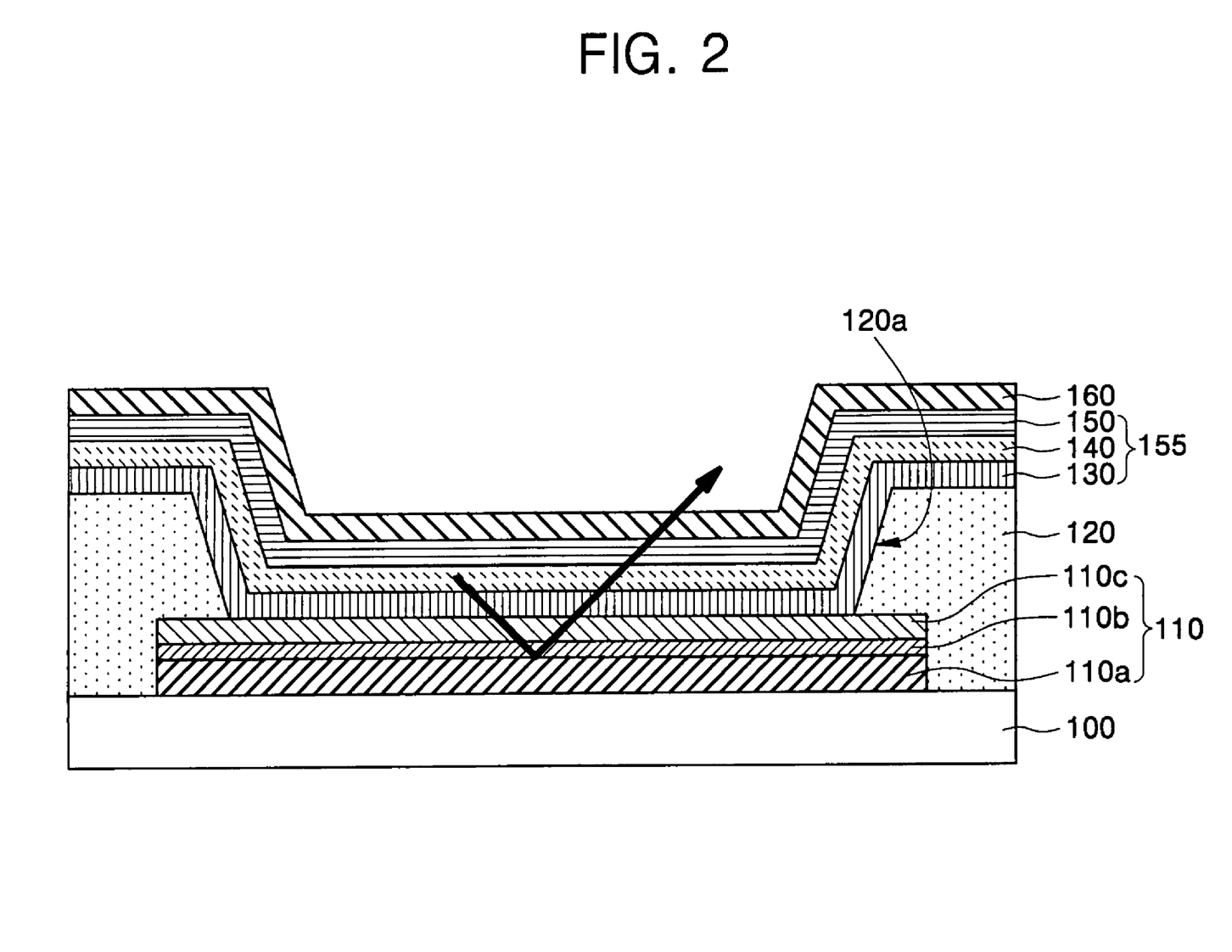
FIG. 2 is a cross-sectional view for illustrating a method of fabricating an organic light-emitting device according to an embodiment of the present invention.

FIG. 2 is a cross-sectional view for illustrating a method of fabricating an organic light-emitting device according to an embodiment of the present invention.

Referring to FIG. 2, there is provided a substrate 100. In the case of an active matrix type organic light-emitting device, the substrate 100 comprises at least one thin film transistor.

A reflective metal layer 110a is formed on the substrate 100. The reflective metal layer 110a is a metal layer for reflecting light and is preferably made of a metal material having excellent reflective properties, that is, reflective metal material. Preferably, the reflective metal layer 110a is made of aluminum (Al), aluminum alloy, silver (Ag), or silver alloy. More preferably, the reflective metal layer 110a is made of aluminum-neodymium (AlNd). Generally, such reflective metal materials have low work functions.

Further, the reflective metal layer 110a is preferably formed by a sputtering method. Also, the reflective metal layer 110a preferably has a thickness of 500 Å or more. If the reflective metal layer 110a has a thickness of below 500 Å, it does not have proper reflectivity.

A reflective metal oxide layer 110b is formed on the reflective metal layer 110a. The reflective metal oxide layer 110b is preferably made of an oxide layer of the metal material employed in forming the reflective metal layer 110a. But, the reflective metal oxide layer 110b may be made of an oxide layer of metal material which is different from the metal material employed in forming the reflective metal layer 110a. The reflective metal oxide layer 110b is preferably made of an aluminum oxide layer, an aluminum-alloy oxide layer, a silver oxide layer, or a silver-alloy oxide layer.

The reflective metal oxide layer 110b can be formed by exposing the reflective metal layer 110a formed on the substrate 10 to air. Thus, the reflective metal layer 110a reacts to oxygen of the air, thereby forming the reflective metal oxide layer 10b as a native oxide layer. At this time, the time of exposing the reflective metal layer 110a to the air is preferably twenty minutes or more. Alternately, the reflective metal oxide layer 110b can be formed by the sputtering method after forming the reflective metal layer 110a. In this case, the reflective metal oxide layer 110b is a sputtered oxide layer.

Preferably, the reflective metal layer 110a and the reflective metal oxide layer 110b are formed in situ by the sputtering method. In this case, the reflective metal material is processed by the sputtering method at a vacuum atmosphere so as to form the reflective metal layer 110a, and then the reflective metal material is processed by the sputtering method at an oxygen atmosphere so as to form the reflective metal oxide layer 110b.

A transparent conductive layer 110c is formed on the reflective metal oxide layer 110b. The transparent conductive layer 110c is preferably made of an indium tin oxide (ITO) layer or an indium zinc oxide (IZO) layer, which has conductivity, transparency, and a high work function. Such transparent conductive layer 110c preferably has a thickness of 50 to 200 Å.

A photoresist pattern is formed on the transparent conductive layer 110c. Then, the transparent conductive layer 110c, the reflective metal oxide layer 110b, and the reflective metal layer 110a are sequentially etched, using the photoresist pattern as a mask. Thus, a reflective anode 110 is formed. The reflective anode 110 has a layered structure of the reflective metal layer 110a, the reflective metal oxide layer 110b, and the transparent conductive layer 110c, in sequence. Thereafter, the photoresist pattern is removed using a strip solution.

In the anode 110, the reflective metal oxide layer 110b acts to prevent the reflective metal layer 110a from contacting with the transparent conductive layer 110c. Therefore, even if the work function difference between the reflective metal layer 110a and the transparent conductive layer 110c is large, interfacial properties therebetween are prevented from being deteriorated. In other words, the reflectivity of the reflective anode 110 is enhanced. Further, even though both the reflective metal layer 110a and the transparent conductive layer 110c are also exposed to the strip solution while the photoresist pattern is removed by the strip solution, corrosion caused by a galvanic phenomenon does not occur therebetween because the reflective metal layer 110a and the transparent conductive layer 110c are not in contact with each other. Therefore, the corrosion is prevented from spreading along an interface between the reflective metal layer 110a and the transparent conductive layer 110c.

Electric conduction between the reflective metal layer 110a and the transparent conductive layer 110c may be implemented by a tunneling effect of an electric charge through the reflective metal oxide layer 110b. Therefore, the reflective metal oxide layer 110b preferably has a thickness of 50 Å or below. Besides, to prevent the reflective metal layer 110a from contacting with the transparent conductive layer 110c, the reflective metal oxide layer 110b preferably has a thickness of 10 Å or more. Consequently, the reflective metal oxide layer 110b preferably has a thickness of 10 to 50 Å.

A pixel defining layer 120 may be formed on the transparent conductive layer 110c. The pixel defining layer 120 is exposed using a photomask, thereby forming an opening 120a in the pixel defining layer 120. Through the opening 120a, a predetermined region of the transparent conductive layer 110c is exposed. Further, an emission region of the organic light-emitting device is defined by the opening 120a. The pixel defining layer 120 is preferably made of benzocyclobutene (BCB), acrylic photoresist, phenol photoresist, or polyimide photoresist.

Further, an organic functional layer 155 having at least an organic emission layer 140 is formed on the exposed transparent conductive layer 110c. In forming the organic functional layer 155, a hole transporting layer 130 is preferably formed on the transparent conductive layer 110c before forming the organic emission layer 140. More preferably, a hole injection layer (not shown) is formed on the transparent conductive layer 110c before forming the hole transporting layer 130. Further, in forming the organic functional layer 155, an electron transporting layer 150 is preferably formed on the organic emission layer 140. More preferably, an electron injection layer (not shown) is formed on the electron transporting layer 150.

A cathode 160 is formed on the organic functional layer 155. The cathode 160 is preferably made of magnesium (Mg), calcium (Ca), aluminum (Al), silver (Ag), or barium (Ba), having a thickness as much as the light can be transmitted therethrough.

Thus, the organic light-emitting device can be fabricated with the reflective anode 110, the cathode 160, and the organic functional layer 155 interposed therebetween. In the organic light-emitting device, the light emitted from the organic emission layer 140 is emitted through the cathode 160 toward the outside, and is also reflected from the reflective metal layer 110a of the anode 110, thereby being emitted through the cathode 160 toward the outside. As described above, the reflective metal layer 110a, i.e., the anode 110 is improved in the reflectivity, so that the intensity of the light emitted to the outside is enhanced, that is, the brightness of the organic light-emitting device is increased.

Figure 3:
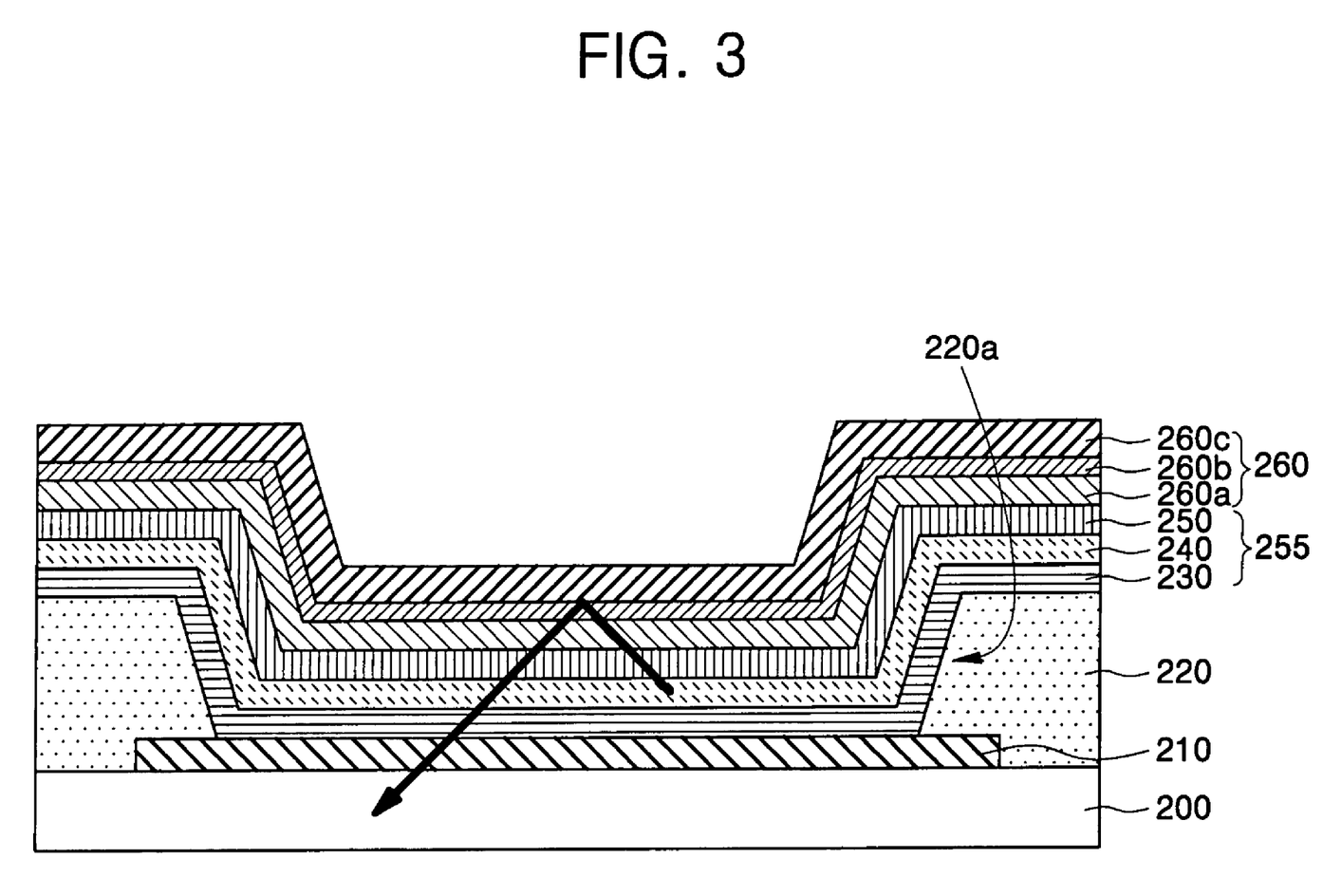
FIG. 3 is a cross-sectional view for illustrating a method of fabricating an organic light-emitting device according to another embodiment of the present invention.

FIG. 3 is a cross-sectional view for illustrating a method of fabricating an organic light-emitting device according to another embodiment of the present invention.

Referring to FIG. 3, there is provided a substrate 200. In the case of an active matrix type organic light-emitting device, the substrate 200 comprises at least one thin film transistor.

A cathode 210 is formed on the substrate 200. The cathode 210 is preferably made of magnesium (Mg), calcium (Ca), aluminum (Al), silver (Ag), or barium (Ba), having a thickness as much as the light can be transmitted therethrough.

A pixel defining layer 220 is formed on the cathode 210. The pixel defining layer 220 is exposed using a photomask, thereby forming an opening 220a in the pixel defining layer 220. Through the opening 220a, a predetermined region of the cathode 210 is exposed. Further, an emission region of the organic light-emitting device is defined by the opening 220a. The pixel defining layer 120 is preferably made of benzocyclobutene (BCB), acrylic photoresist, phenol photoresist, or polyimide photoresist.

Further, an organic functional layer 255 having at least an organic emission layer 240 is formed on the exposed cathode 210. In forming the organic functional layer 255, an electron transporting layer 230 is preferably formed on the cathode 210 before forming the organic emission layer 240. More preferably, an electron injection layer (not shown) is formed on the cathode 210 before forming the electron transporting layer 230. Further, in forming the organic functional layer 255, a hole transporting layer 250 is preferably formed on the organic emission layer 240. More preferably, a hole injection layer (not shown) is formed on the hole transporting layer 250.

A transparent conductive layer 260a is formed on the organic functional layer 255. The transparent conductive layer 260a is preferably made of an indium tin oxide (ITO) layer or an indium zinc oxide (IZO) layer, which has conductivity, transparency, and a high work function. Such transparent conductive layer 260a preferably has a thickness of 50 to 200 Å.

A reflective metal oxide layer 260b is formed on the transparent conductive layer 260a. The reflective metal oxide layer 260b is preferably made of an oxide of the metal material employed for the following reflective metal layer. But, the reflective metal oxide layer 110b may be made of an oxide layer of metal material which is different from the metal material employed in forming the reflective metal layer 110a. The reflective metal oxide layer 260b is preferably made of an aluminum oxide layer, an aluminum-alloy oxide layer, a silver oxide layer, or a silver-alloy oxide layer. The reflective metal oxide layer 260b can be formed by the sputtering method. In this case, the reflective metal oxide layer 260b is a sputtered oxide layer. A reflective metal layer 260c is formed on the reflective metal oxide layer 260b. The reflective metal layer 260c is a metal layer for reflecting light and is preferably made of a metal material having excellent reflective properties, that is, reflective metal material. Preferably, the reflective metal layer 260c is made of aluminum (Al), aluminum alloy, silver (Ag), or silver alloy. More preferably, the reflective metal layer 260c is made of aluminum-neodymium (AlNd). Generally, such reflective metal materials have low work functions.

Further, the reflective metal layer 260c is preferably formed by the sputtering method. Also, the reflective metal layer 260c preferably has a thickness of 500 Å or more. If the reflective metal layer 260c has a thickness of below 500 Å, it does not have proper reflectivity.

Preferably, the reflective metal oxide layer 260b and the reflective metal layer 260c are formed in situ by the sputtering method. In this case, the reflective metal material is processed by the sputtering method at an oxygen atmosphere so as to form the reflective metal oxide layer 260b, and then the reflective metal material is processed by the sputtering method at a vacuum atmosphere so as to form the reflective metal layer 260c. Thus, a reflective anode 260 is formed. The reflective anode 260 has a layered structure of the transparent conductive layer 260a, the reflective metal oxide layer 260b, and the reflective metal layer 260a, in sequence.

In the anode 260, the reflective metal oxide layer 260b acts to prevent the reflective metal layer 260c from contacting with the transparent conductive layer 260a. Therefore, even if the work function difference between the reflective metal layer 260c and the transparent conductive layer 260a is large, interfacial properties therebetween are prevented from being deteriorated. In other words, the reflective anode 260, i.e., the reflective metal layer 260c has improved reflective properties.

Electric conduction between the reflective metal layer 260c and the transparent conductive layer 260a may be implemented by a tunneling effect of an electric charge through the reflective metal oxide layer 260b. Therefore, the reflective metal oxide layer 260b preferably has a thickness of 50 Å or below. Besides, to prevent the reflective metal layer 260a from contacting with the transparent conductive layer 260c, the reflective metal oxide layer 260b preferably has a thickness of 10 Å or more. Consequently, the reflective metal oxide layer 260b preferably has a thickness of 10 to 50 Å.

Thus, the organic light-emitting device can be fabricated with the cathode 210, the anode 260, and the organic functional layer 255 interposed therebetween. In the organic light-emitting device, the light emitted from the organic emission layer 240 is emitted through the cathode 210 toward the outside, and is also reflected from the reflective metal layer 210c of the anode 260, thereby being emitted through the cathode 210 toward the outside. As described above, the reflective metal layer 210c, i.e., the anode 260 is improved in the reflectivity, so that the intensity of the light emitted to the outside is enhanced, that is, the brightness of the organic light-emitting device is increased.

Hereinbelow, an example of the present invention will be described, and the scope of the present invention is not limited to the following example.

EXAMPLE

An aluminum layer (reflective metal layer) was formed on a substrate to a thickness of about 1,000 Å, and the substrate with the aluminum layer was exposed to the air for twenty minutes, thereby forming an aluminum oxide layer (reflective metal oxide layer) having a thickness of about 30 Å on the aluminum layer. Then, ITO (transparent conductive layer) having a thickness of about 100 Å was formed on the aluminum oxide layer. Thereafter, a photoresist pattern was formed on the transparent conductive layer, and then the transparent conductive layer, the aluminum oxide layer, and the aluminum layer are in turn etched using the photoresist pattern as a mask, thereby forming the reflective anode.

Comparative Example 1

A reflective anode was formed by the same method as the example except forming an aluminum layer (reflective metal layer) with a thickness of about 1,000 Å on a substrate, and forming the ITO (transparent conductive layer) having a thickness of about 100 Å on the aluminum layer.

Comparative Example 2

An aluminum layer (reflective metal layer) was formed on a substrate to a thickness of about 1,000 Å.

Figure 4:
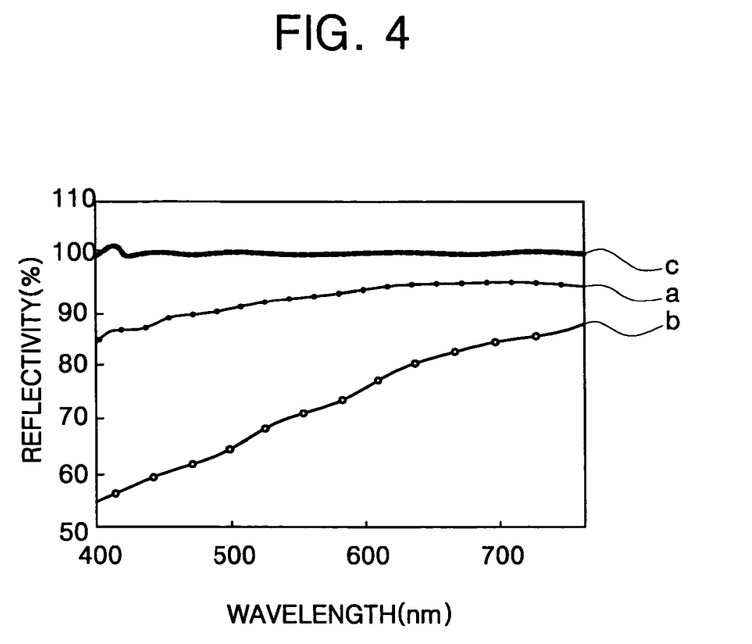
FIG. 4 is a graph showing the reflectivity of reflective anodes based on an example and a comparative example 1, and the reflectivity of a reflective metal layer based on a comparative example 2 with respect to a wavelength.

FIG. 4 is a graph showing the reflectivity of reflective anodes based on the example and the comparative example 1, and the reflectivity of a reflective metal layer based on the comparative example 2 with respect to a wavelength.

Referring to FIG. 4, in the case of the reflective metal layer according to the comparative example 2 (referred to as "c" in FIG. 4), the reflectivity thereof is approximately uniform as 100% with respect to all incident wavelengths. On the other hand, the reflectivity of the reflective anode according to the comparative example 1 (referred to as "b" in FIG. 4) is approximately 55% through 87%, wherein the shorter the wavelength is the lower the reflectivity is. Further, the reflectivity of the reflective anode according to the example (referred to as "a" in FIG. 4) is approximately 85% through 95%, wherein the shorter the wavelength is the lower the reflectivity is, but the reflectivity is slowly decreased as compared with the comparative example 2.

As a result, the reflectivity of the reflective anode according to the example is substantially improved as compared with that of the comparative example 1, and the reflectivity is not substantially changed depending on the wavelength. Thus, the reflective anode improved in the reflectivity enhances the brightness of the organic light-emitting device. Further, the reflectivity is not substantially changed depending on the wavelength. Therefore, in the case of a full-colored organic light-emitting device, the brightness is uniformly realized according to colors.

Figure 5:
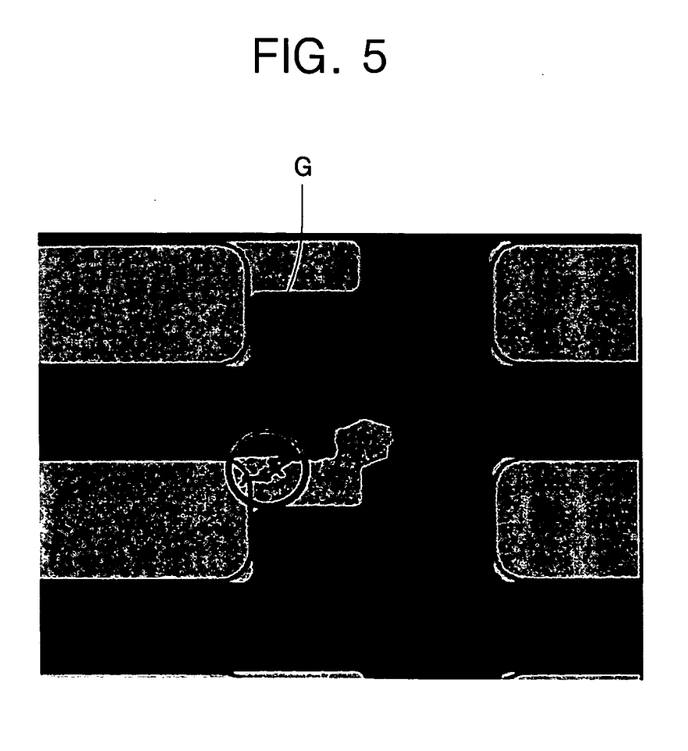
FIG. 5 is a picture showing a reflective anode according to a comparative example 1.

FIG. 5 is a picture showing the reflective anode according to the comparative example 1. Referring to FIG. 5, in the reflective anode according to the comparative example 1, corrosion caused by a galvanic phenomenon occurred between the aluminum layer and the transparent conductive layer, and the corrosion was spread along an interface between the aluminum layer and the transparent conductive layer.

As described above, the present invention provides an organic light-emitting device with a reflective anode and a method of fabricating the same, in which the reflective anode has high reflectivity, the reflectivity thereof is not substantially changed depending on wavelengths, and the reflective anode is free from defects caused by a galvanic phenomenon. Hence, the failure rate of the organic light-emitting device is decreased, the brightness thereof is increased, and the brightness is uniformly realized according to colors in the case of a full-colored organic light-emitting device.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. An organic light-emitting device, comprising:
   an anode comprising a reflective metal layer, a transparent conductive layer, and a reflective metal oxide layer interposed between the reflective metal layer and the transparent conductive layer, with the reflective metal oxide layer having a thickness of approximately 10 Å to approximately 50 Å and being an oxide layer of the reflective metal layer, and the reflective metal layer being formed of one material selected from a group consisting of aluminum (Al), aluminum alloy, silver (Ag), and silver alloy;
   a cathode;
   an organic functional layer interposed between the transparent conductive layer of the anode and the cathode, the organic functional layer comprising at least an organic emission layer; and
   a substrate on which one of the anode and the cathode is placed.

2. The organic light-emitting device as claimed in claim 1, wherein the reflective metal layer is formed of aluminum-neodymium (AlNd).

3. The organic light-emitting device as claimed in claim 1, wherein the reflective metal oxide layer is formed of one selected from a group consisting of an aluminum oxide layer, an aluminum-alloy oxide layer, a silver oxide layer, and a silver-alloy oxide layer.

4. The organic light-emitting device as claimed in claim 1, wherein the reflective metal oxide layer is a native oxide layer or a sputtered oxide layer.

5. The organic light-emitting device as claimed in claim 1, wherein the transparent conductive layer is one of an indium tin oxide (ITO) layer and an indium zinc oxide (IZO) layer.

6. The organic light-emitting device as claimed in claim 1, wherein the cathode is formed of one selected from a group consisting of magnesium (Mg), calcium (Ca), aluminum (Al), silver (Ag), and barium (Ba).

7. The organic light-emitting device as claimed in claim 1, wherein the anode is placed on the substrate, and the cathode is placed on the organic functional layer.

8. The organic light-emitting device as claimed in claim 1, wherein the cathode is placed on the substrate, and the anode is placed on the organic functional layer.

9. A method of fabricating an organic light-emitting device, the method comprising the steps of:
   providing a substrate;
   forming a reflective metal layer on the substrate;
   exposing the reflective metal layer to air to form a reflective metal oxide layer with a
   thickness of approximately 10 Å to approximately 50 Å;
   forming a transparent conductive layer on the reflective metal oxide layer; providing a cathode; and
   forming an organic functional layer having at least an organic emission layer between the transparent conductive layer and the cathode, and the reflective metal layer being formed of one material selected from a group consisting of aluminum (Al), aluminum alloy, silver (Ag), and silver alloy.

10. An organic light-emitting device fabricated by the method of claim 9.

11. An organic light-emitting device fabricated by the process of claim 9, comprised of the anode placed on the substrate, and a cathode placed on the organic functional layer.

12. A method of fabricating an organic light-emitting device, the method comprising the steps of:
   providing a substrate;
   forming a cathode on the substrate;
   forming an organic functional layer provided with at least an organic emission layer on the cathode; and
   forming an anode on the organic functional layer, wherein the step of forming the anode comprises forming a transparent conductive layer on the organic functional layer, forming a reflective metal oxide layer having a thickness of approximately 10 Å to approximately 50 Å and being an oxide of the reflective metal layer on the transparent conductive layer, and forming a reflective metal layer of one material selected from a group consisting of aluminum, aluminum alloy, silver, and silver alloy on the reflective metal oxide layer.

13. The method as claimed in claim 12, wherein the step of forming the reflective metal oxide layer is performed by a sputtering method.

14. The method as claimed in claim 12, wherein the steps of forming the reflective metal layer and the reflective metal oxide layer is performed in situ by the sputtering method.

15. An organic light-emitting device fabricated by the method of claim 12.

16. A method of fabricating an organic light-emitting device, the method comprising the steps of:
   providing a substrate;
   forming a reflective metal layer on the substrate;
   sputtering reflective metal material at an oxygen atmosphere on the reflective metal layer to form a reflective metal oxide layer with a thickness of approximately 10 Å to approximately 50 Å;
   forming a transparent conductive layer on the reflective metal oxide layer;
   forming an organic functional layer having at least an organic emission layer on the transparent conductive layer; and
   providing a cathode on the organic functional layer, and the reflective metal layer being formed of one material selected from a group consisting of aluminum (Al), aluminum alloy, silver (Ag), and silver alloy.

17. An organic light-emitting device fabricated by the method of claim 16.

* * * * *